United States Patent
Bobba et al.

(10) Patent No.: US 6,628,138 B2
(45) Date of Patent: Sep. 30, 2003

(54) INCREASING DECOUPLING CAPACITANCE USING PREFERENTIAL SHIELDS

(75) Inventors: Sudhakar Bobba, Sunnyvale, CA (US); Tyler Thorp, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/997,865

(22) Filed: Nov. 30, 2001

(65) Prior Publication Data

US 2003/0102887 A1 Jun. 5, 2003

(51) Int. Cl.[7] ............................................. H03K 17/16
(52) U.S. Cl. .............................. 326/21; 326/26; 326/82
(58) Field of Search .......................... 326/101, 21, 26, 326/41, 82

(56) References Cited

U.S. PATENT DOCUMENTS

| 5,027,321 A | 6/1991 | Park | 365/185 |
| 5,436,573 A | * 7/1995 | Ogawa et al. | 326/17 |
| 6,184,702 B1 | * 2/2001 | Takahashi et al. | 326/21 |
| 6,229,095 B1 | 5/2001 | Kobayashi | 174/255 |
| 6,285,208 B1 | * 9/2001 | Ohkubo | 326/15 |

FOREIGN PATENT DOCUMENTS

EP 0575892 A1 12/1993

* cited by examiner

*Primary Examiner*—Daniel Chang
(74) *Attorney, Agent, or Firm*—Rosenthal & Osha L.L.P.

(57) ABSTRACT

An integrated circuit that preferentially shields a signal to increase decoupling capacitance is provided. The signal is preferentially shielded based on a probability of the signal being at a specific value. Further, a method for increasing an amount of decoupling capacitance on a circuit through preferential shielding is provided. Further, a method to increase system performance by increasing implicit decoupling capacitance is provided.

21 Claims, 4 Drawing Sheets

INCREASING DECOUPLING CAPACITANCE USING PREFERENTIAL SHIELDS

BACKGROUND OF INVENTION

A typical computer system has at least a microprocessor and memory. The microprocessor processes, i.e., executes, instructions to accomplish various tasks the computer system. Such instructions, along with the data required by the microprocessor when executing these instructions, are stored in some form of memory. FIG. 1 shows a typical computer system having a microprocessor 10 and some form of memory 20. The microprocessor 10 has, among other components, a central processing unit (also known and referred to as "CPU" or "execution unit") 12 and a memory controller (also known as "load/store unit") 14. The CPU 12 is where the actual arithmetic and logical operations of the computer system take place. To facilitate the execution of operations by the CPU 12, the memory controller 14 provides the CPU 12 with necessary instructions and data from the memory 20. The memory controller 14 also stores information generated by the CPU 12 into the memory 20.

The operations that occur in a computer system, such as the logical operations in the CPU and the transfer of data between the CPU and memory, require power. If the components responsible for carrying out specific operations do not receive adequate power in a timely manner, computer system performance is susceptible to degradation. As an added challenge, power consumption of modern computers has increased as a consequence of increased operating frequencies. Thus, providing power to the components in a computer system in a sufficient and timely manner has become an issue of significant importance.

Often, power supplied to a computer system component varies, which, in turn, affects the integrity of the component's output. Typically, this power variation results from the distance between a power supply for the component and the component itself. This distance may lead to the component not receiving power (via current) at the exact time it is required. One approach used by designers to combat this performance-inhibiting behavior is introducing decoupling capacitance (also referred to as "decap") to a particular circuit by positioning one or more decoupling capacitors close to the component. These decoupling capacitors store charge from the power supply and distribute the charge to the component when needed. For example, if power received by a component from a power supply attenuates, one or more decoupling capacitors will distribute charge to the component to ensure that the component is not affected by the power variation on the power supply. In essence, a decoupling capacitor acts as a local power supply for one or more specific components in a computer system.

Within a computer system component, such as a circuit, there are two types of decoupling capacitance: implicit and explicit. Explicit decoupling capacitance is provided to the circuit through the use of decoupling capacitors as discussed above. Implicit decoupling capacitance (also known in the art as "parasitic capacitance" or "inherent capacitance") is capacitance that is inherent in a circuit. Implicit decoupling capacitance results from the electromagnetic effects between current-carrying wires. Further, implicit decoupling capacitance is a function of the distance between two such wires. Also, the ability to help supplement an attenuating voltage using explicit decoupling capacitors or implicit decoupling capacitance is a function of the potential applied to the decaps.

FIG. 2 shows the presence of explicit and implicit decoupling capacitance in a section of a typical computer system component 40. The component 40 has a power supply bus 44 and a ground bus 46 that provides power through a connection to a power supply 42. The power supply 42 may be a part of component 40 or a separate element. Power from the power supply 42 is made available to multiple power supply lines 48 and 52 via connections to the power supply bus 44 and to multiple ground lines 50 and 54 via connections to the ground bus 46. Power from the power supply 42 is delivered to chip logic circuits 60 and 68 via the power supply lines 48 and 52, respectively, and ground lines 50 and 54, respectively. When there is power variation across the power supply 42, explicit decoupling capacitors 56, 57, 58, and 59 positioned in parallel with the power supply 42 provide charge, i.e., power, to the chip logic circuits 60 and 68.

Still referring to FIG. 2, the existence of implicit decoupling capacitances 64, 66, 72, and 74 is shown. A first occurrence of implicit decoupling capacitance 64 occurs between the power supply line 48 and a signal line 62 from the chip logic circuit 60. A second occurrence of implicit decoupling capacitance 66 occurs between the signal line 62 and the ground line 50. The implicit decoupling capacitances 64 and 66 are dependent on the characteristics of the signal line 62, specifically, whether a signal on the signal line 62 is high or low. When the signal is low, the implicit decoupling capacitance provided to the chip logic circuit 60 is equal to the implicit decoupling capacitance 64 between the power supply line 48 and the signal line 62. Alternatively, when the signal is high, the implicit decoupling capacitance provided to the chip logic circuit 60 is equal to the implicit decoupling capacitance 66 between the signal line 62 and the ground line 50.

Still referring to FIG. 2, implicit decoupling capacitance is also present in a substantial number of additional circuits. For example, another first occurrence of implicit decoupling capacitance 72 occurs between the power supply line 52 and a signal line 70 from the chip logic circuit 68. Another second occurrence of implicit decoupling capacitance 74 occurs between the signal line 70 and the ground line 54. The implicit decoupling capacitances 72 and 74 are dependent on the characteristics of the signal line 70, specifically, whether a signal on the signal line 70 is high or low. When the signal is low, the implicit decoupling capacitance provided to the chip logic circuit 68 is equal to the implicit decoupling capacitance 72 between the power supply line 52 and the signal line 70. Alternatively, when the signal is high, the implicit decoupling capacitance provided to the chip logic circuit 68 is equal to the implicit decoupling capacitance 74 between the signal line 70 and the ground line 54.

SUMMARY OF INVENTION

According to one aspect of the present invention, an integrated circuit comprises a signal path having a value switchable between a first potential and a second potential; and a first shield disposed to provide shielding to the signal path, where the first shield is assigned a third potential dependent on a probability of the value being at the first potential versus the second potential.

According to another aspect of the present invention, a method for preferentially shielding a signal having a value switchable between a first potential and a second potential comprises determining a probability of the value being at the first potential versus the second potential, and assigning a third potential to a first shield associated with the signal, where the third potential applied to the shield is assigned based on the probability.

According to another aspect of the present invention, an integrated circuit, comprises a signal path having a value switchable between a first potential and a second potential; and means for preferentially shielding the signal path depending on a probability of the signal being at the first potential versus the second potential.

Other aspects and advantages of the invention will be apparent from the following description and the appended claims.

DETAILED DESCRIPTION

Embodiments of the present invention relate to an integrated circuit that uses preferential shielding to increase implicit decoupling capacitance. embodiments of the present invention further relate to a method for increasing implicit decoupling capacitance. Embodiments of the present invention further relate to a means for increasing implicit decoupling capacitance.

Figure 1:
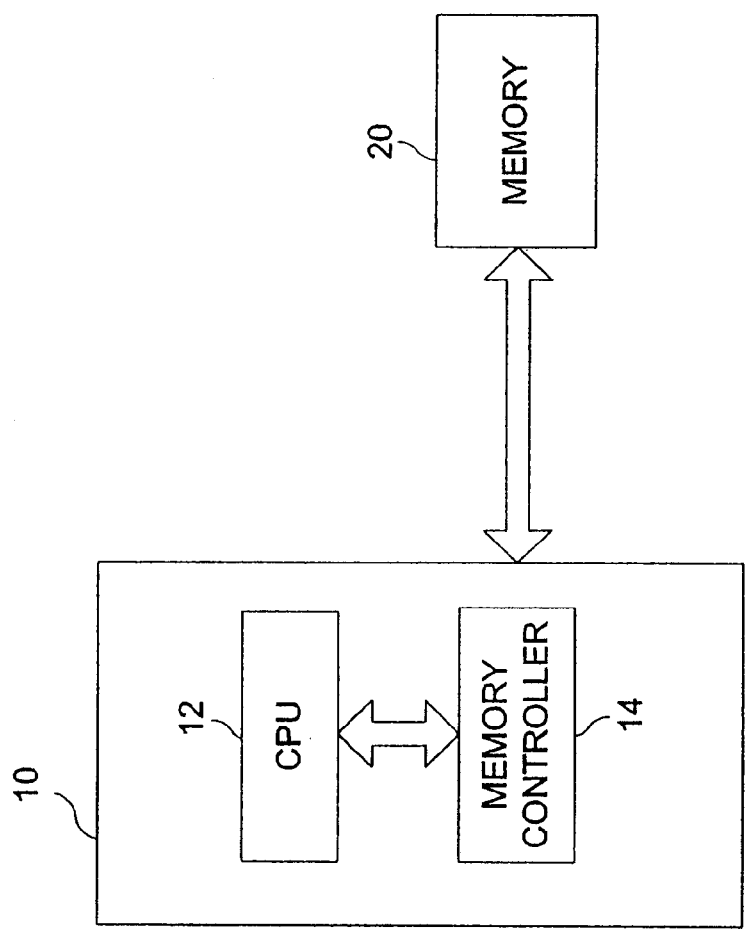
FIG. 1 shows a typical computer system.
Figure 2:
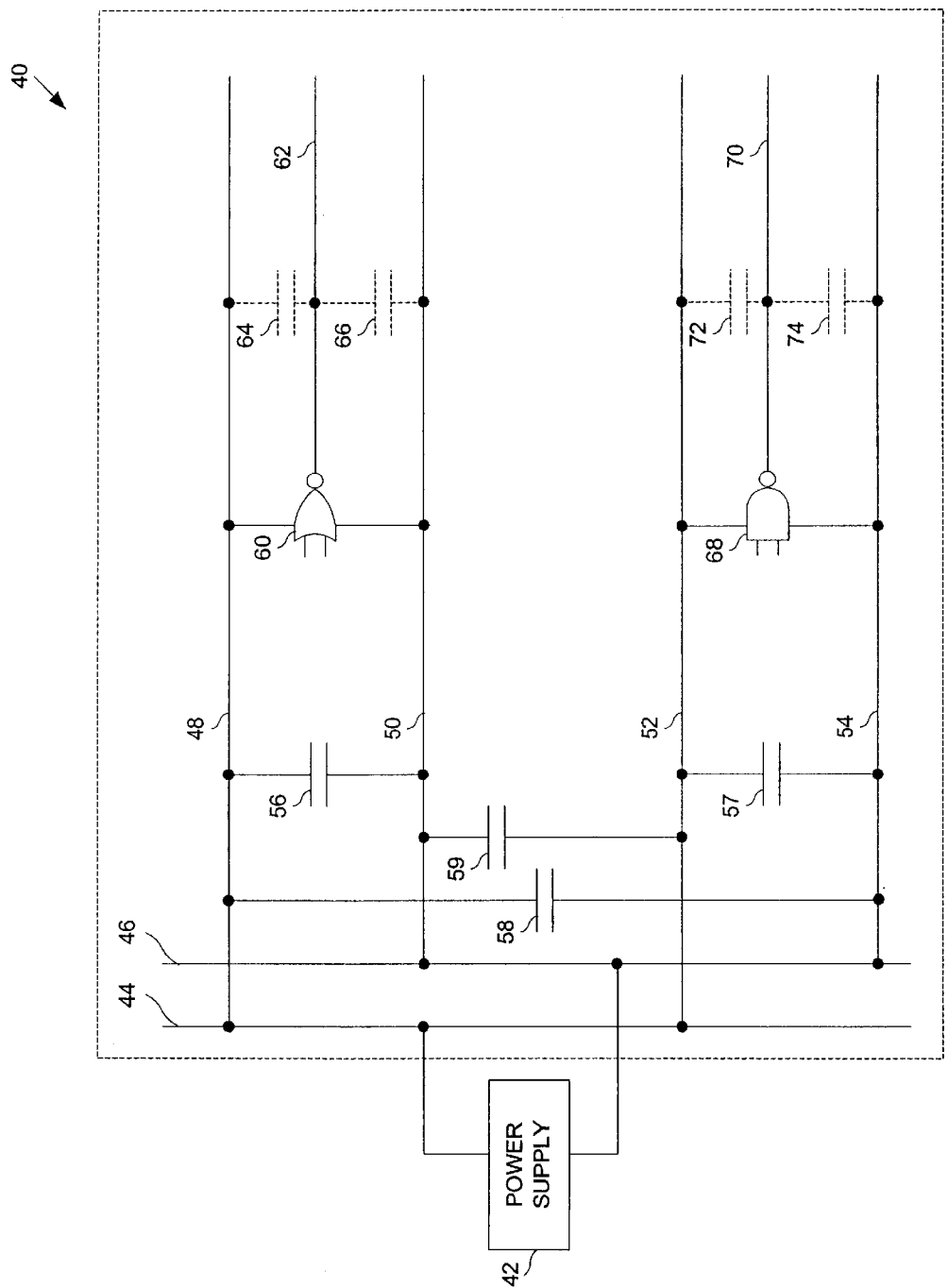
FIG. 2 shows a section of a typical computer system component.

In FIG. 2, during the course of normal operation of the computer system component 40, chip logic circuits 60 and 68 may generate a signal on signal lines 62 and 70 that statistically spends more time in either a high or low state. Depending on the statistically tendencies of the signal lines 62 and 70, the implicit decoupling capacitances 64 and 66 may not be equal, and the implicit decoupling capacitances 72 and 74 may not be equal, respectively.

As discussed above with reference to FIG. 2, a signal on the signal line may be high or low, and depending on the value of that signal, the amount of implicit decoupling capacitance present can be determined. In other words, the amount of implicit decoupling capacitance present on a signal line is a function of whether a signal on the signal line is high or low relative to a respective power supply or ground line. Regardless of whether a signal has a tendency to have a particular value, however, the amount of implicit decoupling capacitance present will be equal to the amount of implicit decoupling capacitance that would be present if the signal had another value. In other words, no preference is given in assigning the potential of the lines near the signal line. For example, although a NOR gate under normal conditions has a tendency to output low, the amount of implicit decoupling capacitance present will be the same for when the NOR gate outputs low and when the NOR gate outputs high.

The present invention takes into account the probability of a signal having a specific value. By knowing the probability, a signal line for the signal is shielded with a preferred potential to increase the implicit decoupling capacitance between the signal line and its shield. By using the probability the signal is at a specific value, those skilled in the art will appreciate that the problem can be formulated to maximize the implicit decoupling capacitance. By using the probability the signal is at a specific value and creating a preferential shield to skew the implicit capacitance, the maximum effective capacitance is achieved.

Figure 3:
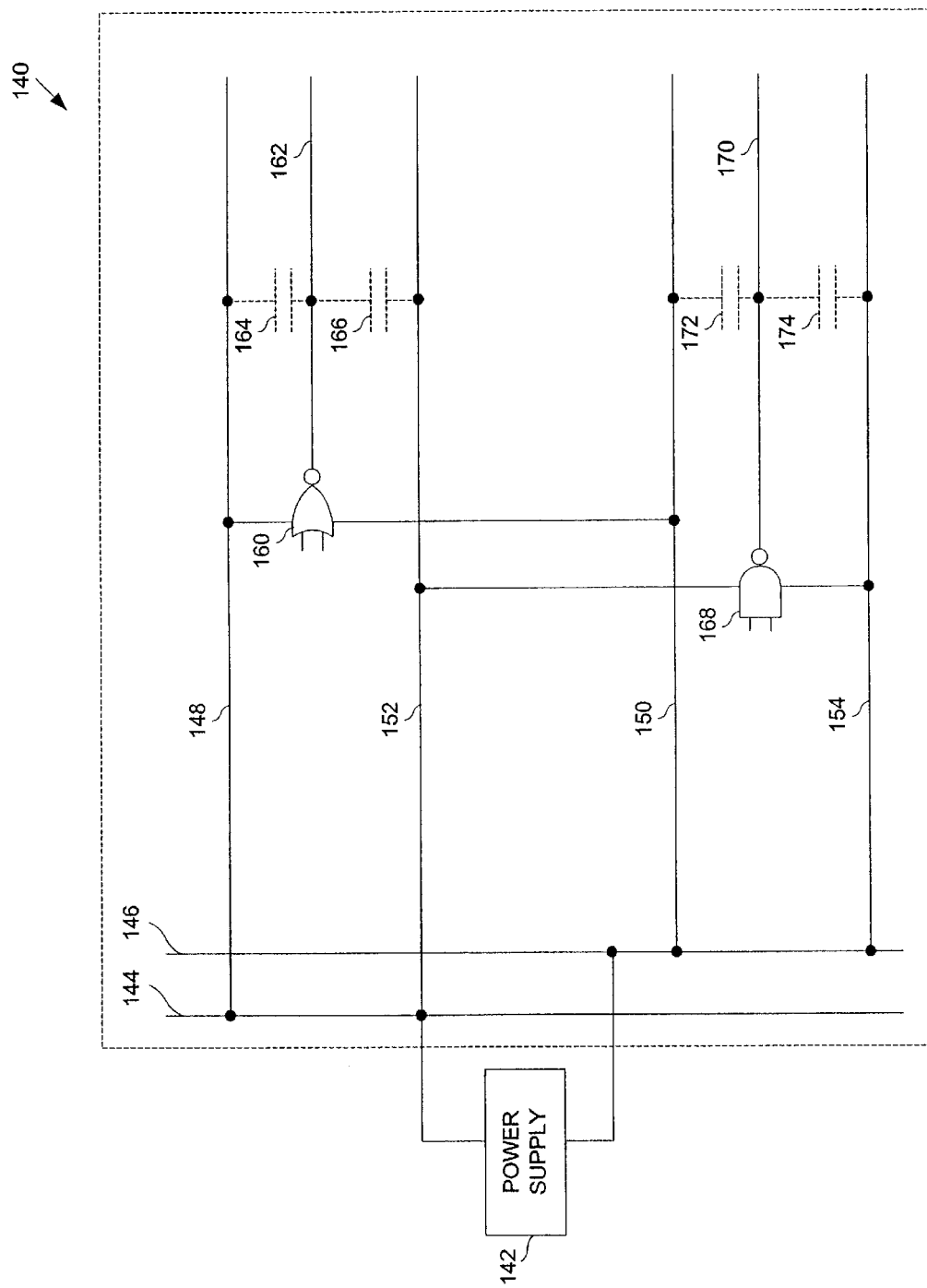
FIG. 3 shows a circuit in accordance with an embodiment of the present invention.

FIG. 3 shows an exemplary circuit 140 in accordance with an embodiment of the present invention. The circuit 140 has a power supply bus 144 and a ground bus 146 that provides power to a two-input NOR gate 160 through a power supply line 148 and a ground line 150. The power supply 142 may be a part of circuit 140 or a separate element. Power from the power supply 142 is made available to multiple power supply lines 148 and 152 via connections to the power supply bus 144 and to multiple ground lines 150 and 154 via connections to the ground bus 146. Power from the power supply 142 is delivered to chip logic circuits 160 and 168 via the power supply lines 148 and 152, respectively, and ground lines 150 and 154, respectively. The two-input NOR gate 160 outputs a signal on a signal line, or signal path, 162. The implicit decoupling capacitance is equal to the implicit decoupling capacitance 164 between the signal line 162 and the power supply line 148, acting as first shield, plus the implicit decoupling capacitance 166 between the signal line 162 and the power supply line 152, acting as second shield, while the signal line 162 is low. The implicit decoupling capacitance is essentially zero while the signal line 162 is high. This relationship may be represented as shown in Equation 1:

$$C_{IMP}=(Decap_1+Decap_2) \text{ when Signal Line=low,}$$

$$C_{IMP}=0 \text{ when Signal Line=high,} \quad (1)$$

where $Decap_1$ is equal to the implicit decoupling capacitance 164 between the power supply line 148 and the signal line 162 when the signal line 162 is low, and $Decap_2$ is equal to the implicit decoupling capacitance 166 between the power supply line 152 and the signal line 162 when the signal line 162 is low. When the signal line 162 is high, both the implicit decoupling capacitances 164 and 166 are essentially zero. From Equation 1, it is apparent that shielding signal line 162 with power supply line 148 and power supply line 152 increases the amount of implicit decoupling capacitance. In fact, the longer signal line 162 is low, the greater the implicit decoupling capacitance, as shown in Equation 1. Equally stated, the average implicit decoupling capacitance over time is the probability the signal line 162 is low times the implicit decoupling capacitance when the signal line 162 is low, as defined in Equation 1. The average decoupling capacitance $AvgC_{IMP}$ is $$AvgC_{IMP}=P_L*(Decap_1+Decap_2) \quad (2)$$

where $P_L$ is equal to the probability that the signal is low. From Equation 2, it is apparent that in order to maximize the amount of implicit decoupling capacitance, the implicit decoupling capacitance is increased for the situation that has the higher probability on the signal line 162.

Of the four possible input combinations to the NOR gate 160, only one combination results in the NOR gate 160 outputting high. The other three input combinations result in the NOR gate 160 outputting low. Assuming an independent and evenly distributed probability for the inputs to the NOR gate 160, the probability that a signal outputted from the NOR gate 160 will be high is 0.25 and the probability that a signal outputted from the NOR gate 160 will be low is 0.75. Accordingly, the signal from the NOR gate 160 is said to be "predominantly low."

In order to maximize the amount of implicit decoupling capacitance on the signal line 162 according to Equation 2, the signal line 162 is shielded such that both of the shielding lines 148 and 152 are connected to the power supply bus 144. The signal on the signal line 162 is three times more likely to be low; therefore, the implicit decoupling capacitance created by implicit decoupling capacitance 164 and implicit decoupling capacitance 166 exists 75% of the time and provides essentially no implicit decoupling capacitance only 25% of the time.

Those skilled in the art will appreciate that shield assignment, whether it is with a power supply line and a ground line, with a power supply line and a power supply line, or with a ground line and a ground line, the delay of the signal on the signal line does not change. Using preferential shielding, therefore, does not increase the signal delay compared to typical shielding arrangements. By creating an imbalance in the implicit decoupling capacitance based on the probability the signal is at a specific value, the amount of implicit decoupling capacitance is increased.

Those skilled in the art will appreciate that power supply line 148 and power supply line 152 act as shields. Further, those skilled in the art will appreciate that a different potential can be used on shielding line 148 and shielding line 152. Those skilled in the art will also appreciate that only one shielding line 148 or shielding line 152 may be used.

Continuing in FIG. 3, the exemplary circuit 140 is also provided with a two-input NAND gate 168 that receives power from the power supply bus 144 and from the ground bus 146 via power supply line 152 and ground line 154. The two-input NAND gate 168 outputs a signal on a signal line, or signal path, 170. The implicit decoupling capacitance is equal to the implicit decoupling capacitance 172 between the signal line 170 and the ground line 150, acting as a first shield, plus the implicit decoupling capacitance 174 between the signal line 170 and the ground line 154, acting as a second shield, while the signal line 170 is high. The implicit decoupling capacitance is essentially zero while the signal line 170 is low. This relationship may be represented as shown in Equation 3:

$$C_{IMP}=(\text{Decap}_1+\text{Decap}_2) \text{ when Signal Line=high,}$$

$$C_{IMP}=0 \text{ when Signal Line=low,} \quad (3)$$

where $\text{Decap}_1$ is equal to the implicit decoupling capacitance 172 between the ground line 150 and the signal line 170 is high, and $\text{Decap}_2$ is equal to the implicit decoupling capacitance 174 between the ground line 154 and the signal line 170 when the signal line 170 is high. When the signal line 170 is low, both the implicit decoupling capacitances 172 and 174 are essentially zero. From Equation 3, it is apparent that that shielding signal line 170 with ground line 150 and ground line 154 increases the amount of implicit decoupling capacitance. In fact, the longer signal line 170 is high, the greater the implicit decoupling capacitance, as shown in Equation 3. Equally stated, the average implicit decoupling capacitance over time is the probability the signal line 170 is high times the implicit decoupling capacitance when the signal line 170 is high, as defined in Equation 3. The average decoupling capacitance $\text{Avg}C_{IMP}$ is $$\text{Avg}C_{IMP}=P_H*(\text{Decap}_1+\text{Decap}_2), \quad (4)$$

where $P_H$ is equal to the probability that the signal is high. From Equation 4, it is apparent that in order to maximize the amount of implicit decoupling capacitance, the implicit decoupling capacitance is increased for the situation that has the higher probability on the signal line 170.

Of the four possible input combinations to the NAND gate 168, only one combination results in the NAND gate 168 outputting low. The other three input combinations result in the NAND gate 168 outputting high. Assuming an independent and evenly distributed probability for the inputs to the NAND gate 168, the probability that a signal outputted from the NAND gate 168 will be low is 0.25 and the probability that a signal outputted from the NAND gate 168 will be high is 0.75. Accordingly, the signal from the NAND gate 168 is said to be "predominantly high."

In order to maximize the amount of implicit decoupling capacitance on the signal line 170 according to Equation 4, the signal line 170 is shielded such that both of the shielding lines 150 and 154 are connected to the ground bus 146. The signal on the signal line 170 is three times more likely to be high; therefore, the implicit decoupling capacitance created by implicit decoupling capacitance 172 and implicit decoupling capacitance 174 exists 75% of the time and provides essentially no implicit decoupling capacitance only 25% of the time.

Those skilled in the art will appreciate that shield assignment, whether it is with a power supply line and a ground line, with a power supply line and a power supply line, or with a ground line and a ground line, the delay of the signal on the signal line does not change. Using preferential shielding, therefore, does not increase the signal delay compared to typical shielding arrangements. By creating an imbalance in the implicit decoupling capacitance based on the probability the signal is at a specific value, the amount of implicit decoupling capacitance is increased.

Those skilled in the art will appreciate that ground line 150 and ground line 154 act as shields. Further, those skilled in the art will appreciate that a different potential can be used on shielding line 150 and shielding line 154. Those skilled in the art will also appreciate that only one shielding line 150 or shielding line 154 may be used.

By way of comparison, the average implicit decoupling capacitance in FIG. 2 and FIG. 3 are calculated assuming independent and evenly distributed probability for the inputs to all logic circuits, and the implicit decoupling capacitances are of equal value which are now referred to simply as "Decap". For FIG. 2, the signal line 62 has a 0.25 probability of being high and a 0.75 probability of being low. Accordingly, the average implicit decoupling capacitance is 0.25 Decap to the ground line 50 and 0.75 Decap to the power supply line 48. Likewise in FIG. 2, the signal line 70 has a 0.25 probability of being low and a 0.75 probability of being high. Accordingly, the average implicit decoupling capacitance is 0.25 Decap to the power supply line 52 and 0.75 Decap to the ground line 54. Essentially, the power supply lines 48 and 52 combined see one Decap and the ground lines 50 and 54 combined see one Decap. For FIG. 3, the signal line 162 has a 0.25 probability of being high and a 0.75 probability of being low. Accordingly, the average implicit decoupling capacitance is 0.75*2* Decap, or 1.5 Decap, to power supply lines 148 and 152. Likewise in FIG. 3, the signal line 170 has a 0.25 probability of being low and a 0.75 probability of being high. Accordingly, the average implicit decoupling capacitance is 0.75*2* Decap, or 1.5 Decap, to ground lines 150 and 154. Those skilled in the art will appreciate that shielding the signal lines 162 and 170 with a preferential potential on the shielding lines in this manner increases the implicit decoupling capacitance associated with the signal lines 162 and 170.

Those skilled in the art will appreciate that although the embodiments shown in FIG. 3 use two-input logic gates, circuit logic having any number of inputs may be used. Also, although NAND and NOR gates are used for purposes of illustration, any type of logic gate may be used. All that is required is that one be able to ascertain the probability of a value on an output signal from particular circuit logic. Further, those skilled in the art will appreciate that the embodiments shown in FIG. 3 may reside in an integrated circuit or other electrical component.

Figure 4:
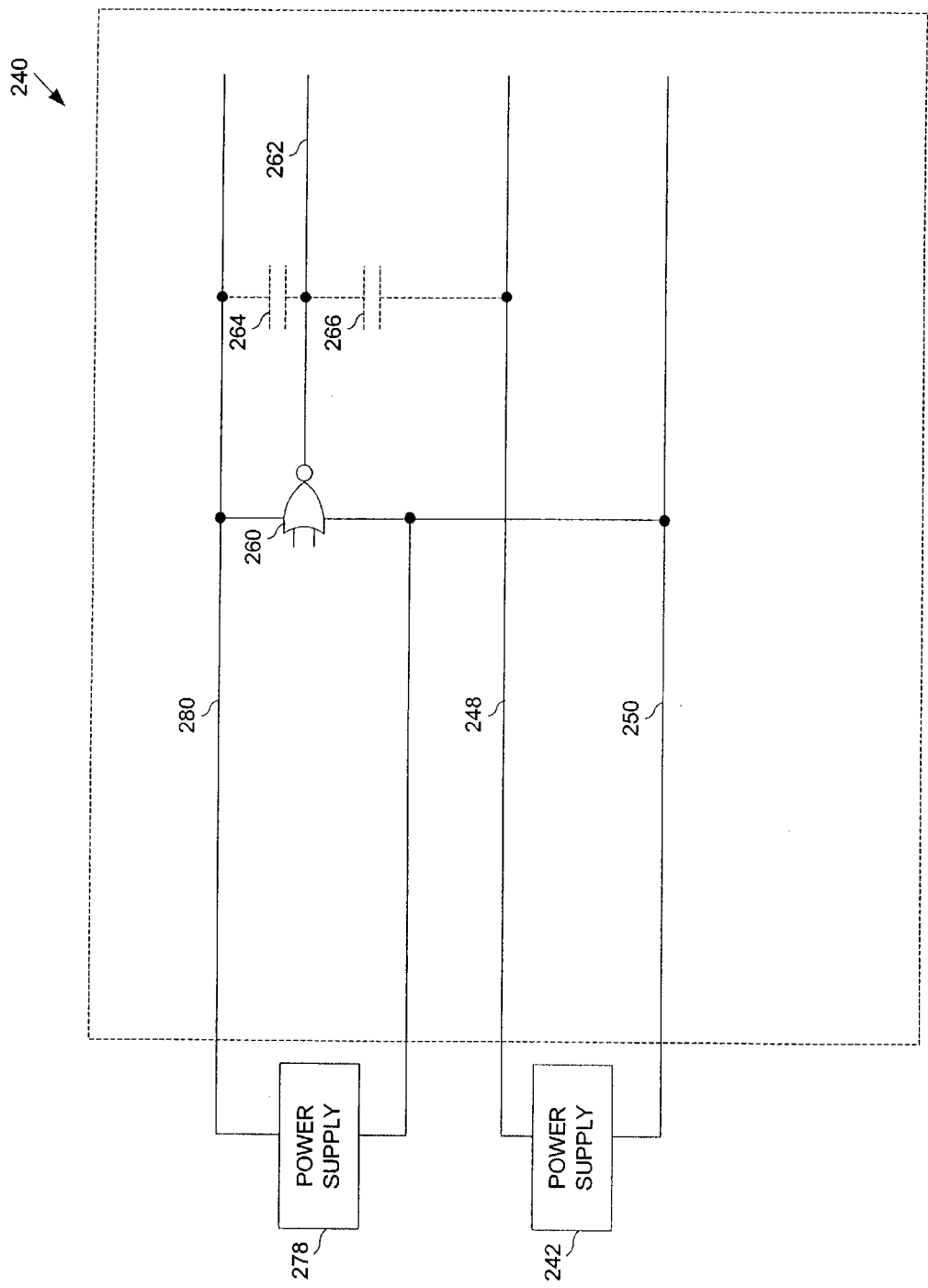
FIG. 4 shows a circuit in accordance with another embodiment of the present invention.

FIG. 4 shows an exemplary circuit 240 in accordance with an embodiment of the present invention. The circuit 240 has a power supply line 280 and a ground line 250 that provides power to, in this example, a two-input NOR gate 260. Power is provided to the power supply line 280 and the ground line 250 through a power supply 278. The power supply 278 may be a part of circuit 240 or a separate element. A power supply 242 also exists that supplies power through power supply line 248 and a ground line 250. The power supply 242 may be a part of circuit 240 or a separate element. In this embodiment, the ground line is common between both power supply 278 and power supply 242. Those skilled in the art will appreciate that the ground line 250 may actually be multiple lines that do not physically connect to one another. The two-input NOR gate 260 outputs a signal on a signal line, or signal path, 262. The implicit decoupling capacitance is equal to the implicit decoupling capacitance 264 between the signal line 262 and the power supply line 280, acting as a first shield, plus the implicit decoupling capacitance 266 between the signal line 262 and the power supply line 248, acting as a second shield, while the signal line 262 is low. The implicit decoupling capacitance is essentially zero while the signal line 262 is high. This relationship may be represented as shown in Equation 5:

$$C_{IMP}=(Decap_1+Decap_2) \text{ when Signal Line=low,}$$

$$C_{IMP}=0 \text{ when Signal Line=high,} \quad (5)$$

where $Decap_1$ is equal to the implicit decoupling capacitance 264 between the power supply line 280 and the signal line 262 when the signal line 262 is low, and $Decap_2$ is equal to the implicit decoupling capacitance 266 between the power supply line 248 and the signal line 262 when the signal line 262 is low. When the signal line 262 is high, both the implicit decoupling capacitances 264 and 266 are essentially zero. From Equation 5, it is apparent that shielding signal line 262 with power supply line 280 and power supply line 248 increases the amount of implicit decoupling capacitance. In fact, the longer signal line 262 is low, the greater the implicit decoupling capacitance, as shown in Equation 5. Equally stated, the average implicit decoupling capacitance over time is the probability the signal line 262 is low times the implicit decoupling capacitance when the signal line 262 is low, as defined in Equation 5. The average decoupling capacitance $AvgC_{IMP}$ is $$AvgC_{IMP}=P_L*(Decap_1+Decap_2), \quad (6)$$

where $P_L$ is equal to the probability that the signal is low. From Equation 6, it is apparent that in order to maximize the amount of implicit decoupling capacitance, the implicit decoupling capacitance is increased for the situation that has the higher probability on the signal line 262.

Of the four possible input combinations to the NOR gate 260, only one combination results in the NOR gate 260 outputting high. The other three input combinations result in the NOR gate 260 outputting low. Assuming an independent and evenly distributed probability for the inputs to the NOR gate 260, the probability that a signal outputted from the NOR gate 260 will be high is 0.25 and the probability that a signal outputted from the NOR gate 260 will be low is 0.75. Accordingly, the signal from the NOR gate 260 is said to be "predominantly low."

In order to maximize the amount of implicit decoupling capacitance on the signal line 262 according to Equation 6, the signal line 262 is shielded such that both of the shielding lines 280 and 248 are connected to the power supplies 278 and 242, respectively. The signal on signal line 262 is three times more likely to be low; therefore, the implicit decoupling capacitance created by implicit decoupling capacitance 264 and implicit decoupling capacitance 266 exists 75% of the time and provides essentially no implicit decoupling capacitance only 25% of the time.

Those skilled in the art will appreciate that shield assignment, whether it is with a power supply line and a ground line, with a power supply line and a power supply line, or with a ground line and a ground line, the delay of the signal on the signal line does not change. Using preferential shielding, therefore, does not increase the signal delay compared to typical shielding arrangements. By creating an imbalance in the implicit decoupling capacitance based on the probability the signal is at a specific value, the amount of implicit decoupling capacitance is increased.

Continuing in FIG. 4, the power supply 278 connects to the implicit decoupling capacitance 264 through shielding line 280, and power supply 242 connects to the implicit decoupling capacitance 266 through shielding line 248. The power supplies 278 and 242 are not required to operate at the same potential. Consequently, the decoupling ability of the implicit decoupling capacitance 264 and the implicit decoupling capacitance 266 may not be same due to the stored charge differences. Those skilled in the art will appreciate that shielding the signal line 262 with one or more preferential potentials on the shielding lines in this manner increases the ability of the implicit decoupling capacitance associated with the signal line 262 to maintain the potential on the shielding lines. Those skilled in the art will also appreciate that only one shielding line 280 or shielding line 248 may be used.

Those skilled in the art will appreciate that although the embodiments shown in FIG. 4 use a two-input logic gate, circuit logic having any number of inputs may be used. Also, although a NAND gate is used for purposes of illustration, any type of logic gate may be used. All that is required is that one be able to ascertain the probability of a value on an output signal from particular circuit logic. Further, those skilled in the art will appreciate that the embodiments shown in FIG. 4 may reside in an integrated circuit or other electrical component.

Advantages of the present invention may include one or more of the following. In some embodiments, because a signal is preferentially shielded, a circuit may have more decoupling capacitance than when the signal is not shielded by a preferred potential.

In some embodiments, because a signal is shielded with a preferred potential, increased decoupling capacitance is provided to one or more components in a computer system, effectively leading to better system performance.

In some embodiments, because implicit decoupling capacitance is increased through preferential shielding, fewer explicit decoupling capacitors are needed, and thus, more components may be positioned on an integrated circuit.

In some embodiments, because implicit decoupling capacitance is higher, the number of explicit decoupling capacitors that must be added is reduced; therefore, a smaller integrated circuit die may be used.

While the present invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a signal path having a value switchable between a first potential and a second potential;

a first shield disposed to provide shielding to the signal path;

a second shield disposed to provide shielding to the signal path, wherein the first shield is assigned a first fixed potential dependent on a probability of the value being at the first potential versus the second potential, wherein the second shield is assigned a second fixed potential dependent on the probability, and wherein the first fixed potential and the second fixed potential are substantially equal.

2. The integrated circuit of claim 1, wherein the first fixed potential is closer in value to the first potential than to the second potential when the probability of the value of the signal being at the second potential is greater.

3. The integrated circuit of claim 1, wherein the first fixed potential is closer in value to the second potential than to the first potential when the probability of the value of the signal being at the first potential is greater.

4. The integrated circuit of claim 1, wherein the first shield is operatively connected to a power supply.

5. The integrated circuit of claim 1, wherein the signal path is operatively connected to a logic component.

6. The integrated circuit of claim 1, wherein the first potential is a logic low and the second potential is a logic high.

7. The integrated circuit of claim 1, wherein the first fixed potential and the second fixed potential are closer in value to the first potential than to the second potential when the probability of the value of the signal being at the second potential is greater.

8. The integrated circuit of claim 1, wherein the first fixed potential and the second fixed potential are closer in value to the second potential than to the first potential when the probability of the value of the signal being at the first potential is greater.

9. The integrated circuit of claim 1, wherein the first shield and the second shield are operatively connected to power.

10. The integrated circuit of claim 1, wherein the first shield and the second shield are operatively connected to ground.

11. A method for preferentially shielding a signal having a value switchable between a first potential and a second potential, comprising:

determining a probability of the value being at the first potential versus the second potential;

assigning a first fixed potential to a first shield associated with the signal; and assigning a second fixed potential to a second shield associated with the signal, wherein the first fixed potential applied to the first shield is assigned based on the probability, wherein the second fixed potential applied to the second shield is assigned based on the probability, and wherein the first fixed potential and the second fixed potential are substantially equal.

12. The method of claim 11, wherein the first fixed potential is closed in value to the first potential than to the second potential when the probability of the value of the signal being at the second potential is greater.

13. The method of claim 11, wherein the first fixed potential is closer in value to the second potential than to the first potential when the probability of the value of the signal being at the first potential is greater.

14. The method of claim 11, wherein the first shield is operatively connected to a power supply.

15. The method of claim 11, wherein the signal path is operatively connected to a logic element.

16. The method of claim 11, wherein the first potential is a logic low and the second potential is a logic high.

17. The method of claim 11, wherein the first fixed potential and the second fixed potential are closer in value to the first potential than to the second potential when the probability of the value of the signal being at the second potential is greater.

18. The method of claim 11, wherein the first fixed potential and the second fixed potential are closer in value to the second potential than to the first potential when the probability of the value of the signal being at the first potential is greater.

19. The method of claim 11, wherein the first shield and the second shield are operatively connected to power.

20. The method of claim 11, wherein the first shield and the second shield are operatively connected to ground.

21. An integrated circuit, comprising:

a signal path having a value switchable between a first potential and a second potential; and first means for preferentially shielding the signal path depending on a probability of the signal being at the first potential versus the second potential; and second means for preferentially shielding the signal path depending on the probability, wherein the first means and the second means have fixed potentials.

* * * * *